United States Patent
Tam

(10) Patent No.: US 7,199,619 B2
(45) Date of Patent: Apr. 3, 2007

(54) HIGH-SPEED DIFFERENTIAL LOGIC MULTIPLEXER

(75) Inventor: Kimo Y. F. Tam, Lincoln, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/945,144

(22) Filed: Sep. 20, 2004

(65) Prior Publication Data

US 2006/0061390 A1    Mar. 23, 2006

(51) Int. Cl.
*H03K 19/094* (2006.01)
*H03K 17/00* (2006.01)

(52) U.S. Cl. .................................. 326/105; 327/407
(58) Field of Classification Search .................. 326/26, 326/27, 105–108; 370/537; 327/407
See application file for complete search history.

(56) References Cited

U.S. PATENT DOCUMENTS

| 5,493,254 A | 2/1996 | Fairgrieve ................... 330/260 |
| 5,734,272 A | 3/1998 | Belot et al. ................. 326/126 |
| 6,239,646 B1 | 5/2001 | Navabi et al. .............. 327/407 |
| 6,385,214 B1 * | 5/2002 | Kikuchi et al. ............. 370/537 |

* cited by examiner

*Primary Examiner*—Daniel Chang
(74) *Attorney, Agent, or Firm*—Bromberg & Sunstein LLP

(57) ABSTRACT

A circuit for a high speed digital multiplexer has an active load circuit connected to an output of the digital multiplexer. The active load circuit loads the multiplexer output with a transimpedance stage with low input resistance to reduce the RC time constant at the multiplexer output. The active load circuit may be based on two active devices connected to the multiplexer output so as to form a differential cascode circuit.

32 Claims, 4 Drawing Sheets

HIGH-SPEED DIFFERENTIAL LOGIC MULTIPLEXER

FIELD OF THE INVENTION

The invention generally relates to data switching circuits, and more specifically to an active load circuit for a high speed digital multiplexer.

BACKGROUND ART

Complex digital data circuits use various architectures to distribute data signals between multiple locations. A digital crosspoint switch can selectably connect data signals between multiple inputs and multiple outputs. One way to implement a crosspoint switch is as an array of multiplexer stages. For example, a 32×32 crosspoint switch can be implemented as an array of thirty-two 32:1 multiplexers which share a 32-input bus.

FIG. 1 shows the functional block architecture of a typical crosspoint switch. The left edge of the figure shows inputs 0–39 and the bottom edge shows outputs 0–35. Any input can be connected to any number of outputs. Each of the smaller dashed line boxes along the left side of FIG. 1 represents a two-stage input buffer. The larger dashed line boxes in the center of the figure are arrays of point cells to connect a selected input to a selected output. The smaller dashed line boxes along the bottom side of the figure are two-stage multiplexers to selectably connect multiple data paths to a given output port. As shown in FIG. 1, each of the second stage input buffers and first stage output multiplexers may serve only a subset of the output and input ports respectively. In addition, at high data speeds above 1 Gb/sec, the crosspoint may be further timesliced using parallel paths into alternating data slices at half the data rate each.

FIG. 2 provides a slice of such a crosspoint switch showing a single path connecting one input port to one output port. The crosspoint switch can be conceptually divided into a high-speed data path (shown by thin lines in FIG. 2) and a lower-speed control plane that determines connectivity (shown by thick lines in FIG. 2). The control plane is run by a digital clocking signal and determines which pieces of the data path should be enabled for a given connectivity and when the enabling signals should change. For the switch control plane, connectivity data to control the data path may be written into control latches or flip-flops.

In FIG. 2, the first stage buffer 21 provides a high impedance input (with reduced input capacitance) and converts signal levels, for example, from CMOS to current mode logic (CML). Driving four sets of input lines from each of the second stage input buffers 22 reduces the number of point cells 23 loading each input by a factor of four (only nine point cells 23 on each second stage buffer 22). Groups of multiple point cells are provided to first stage multiplexers 24 to allow the associated data streams to be directed to selected output ports. The capacitance load on each point cell 23 (which may be simply resistively loaded CML buffers) is reduced by collecting five first stage multiplexers 24 for each second stage multiplexer 25 such that each first stage multiplexer collects eight inputs. The second stage multiplexer 25 also provides signal level conversion; for example, from CML to full swing CMOS.

A cross-point switch such as in FIGS. 1 and 2 may be conveniently implemented using differential current mode logic because of its simplicity, relatively high-speed, low supply noise generation, and high supply noise immunity. But the loads for differential current mode logic circuits are simply resistors, and thus, current mode logic suffers from poor load drive capability and poor speed vs. fan-in (i.e., number of inputs in a gate) trade off. And as data speeds approach and surpass the 1 GHz threshold, circuit reactances create various problems which are not so significant at lower data speeds. In a 32-input multiplexer, the slow down in circuit speed due to delay and rise time would be on the order of 32 times slower than for a simple gate (such as an inverter). And increasing the scale of the input devices provides no speed improvement because the circuit is limited by self-loading.

SUMMARY OF THE INVENTION

Embodiments of the present invention are directed to an active load circuit connected to an output of a high speed digital multiplexer, and to methods of operating such a circuit. The active load circuit loads the multiplexer output with an active transimpedance stage with low input resistance (near zero) to reduce the RC time constant at the multiplexer output. The high speed digital multiplexer may be, for example, a current mode logic circuit.

In further specific embodiments, the active load circuit may be based on two active devices connected to the multiplexer output so as to form a differential cascode circuit. Each active device may also have a biasing control resistor cross-coupled to a current supply path of the other active device. The biasing control resistor establishes a device biasing voltage that controls gain of the device. In such an embodiment, the value of each biasing control resistor may be equal to the inverse transconductance of its active device. A further embodiment may also include for each active device a swing setting resistor connecting an output node of the active device to the control biasing resistor of the other active device. The swing setting resistor establishes a voltage swing for its active device. The active devices may be medium threshold devices. In addition, to reduce the headroom penalty looking into the inputs of the active load, a replica circuit may bias the backgate terminals to a level near a drain supply voltage (for example, about one threshold voltage below the drain supply voltage).

Embodiments of the present invention also include a multiplexer containing any of the active load circuits above. Embodiments also include a crosspoint switch containing any of the active load circuits above.

DETAILED DESCRIPTION OF SPECIFIC EMBODIMENTS

Various embodiments of the present invention are directed to techniques for using an active load circuit to reduce the RC time constant at the output terminals of a high speed digital multiplexer (common terminals which are also the active load circuit inputs) such as is used in a crosspoint switch. Such an approach allows for a current mode logic implementation of such high fan-in circuits with reduced delay and low-complexity overhead. The multiplexer can be implemented as an array of simple input stages and a low-input-impedance load. This facilitates implementation of high-speed crosspoint switches.

Figure 1:
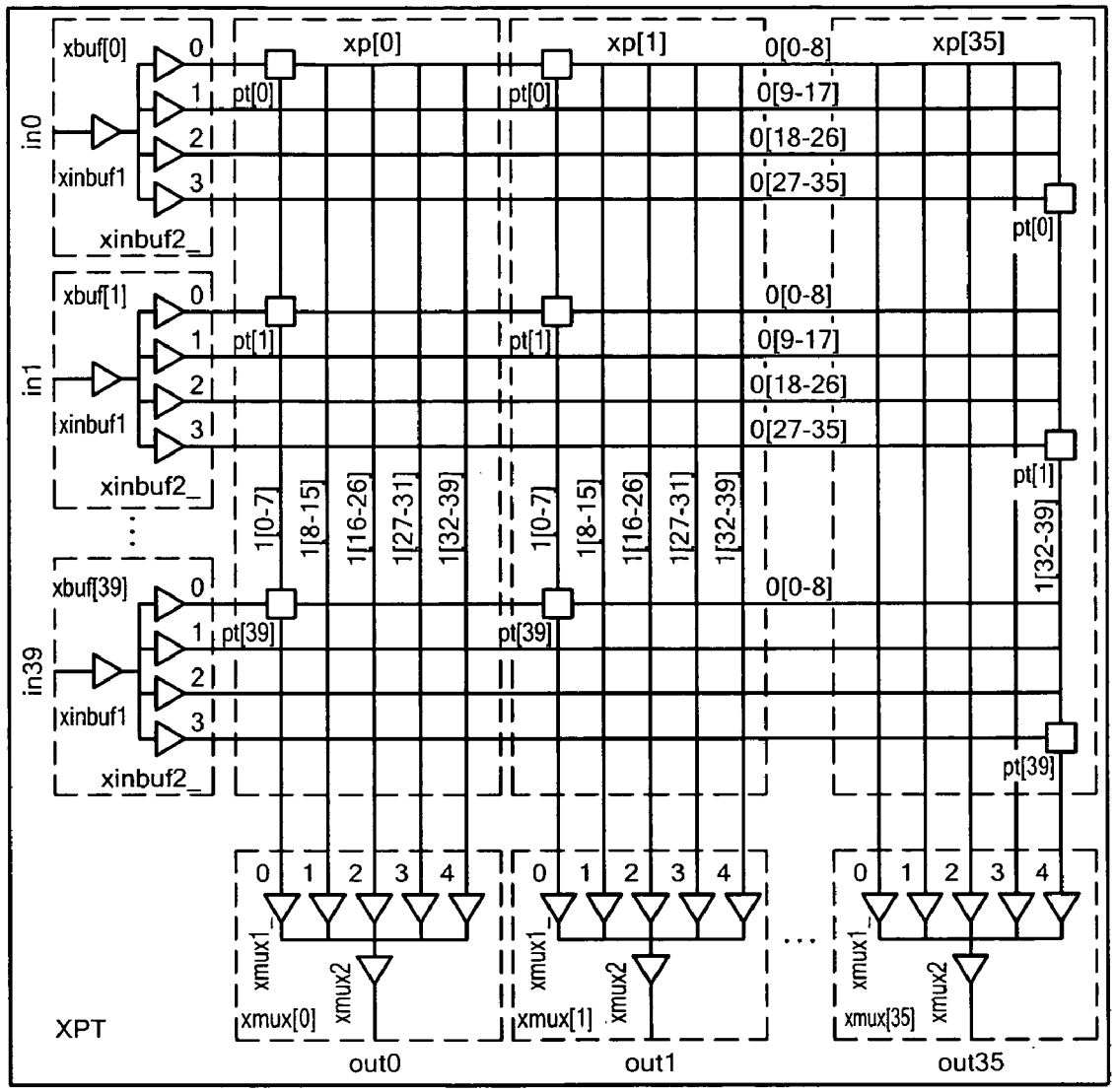
FIG. 1 shows the functional block architecture of a typical crosspoint switch.
Figure 2:
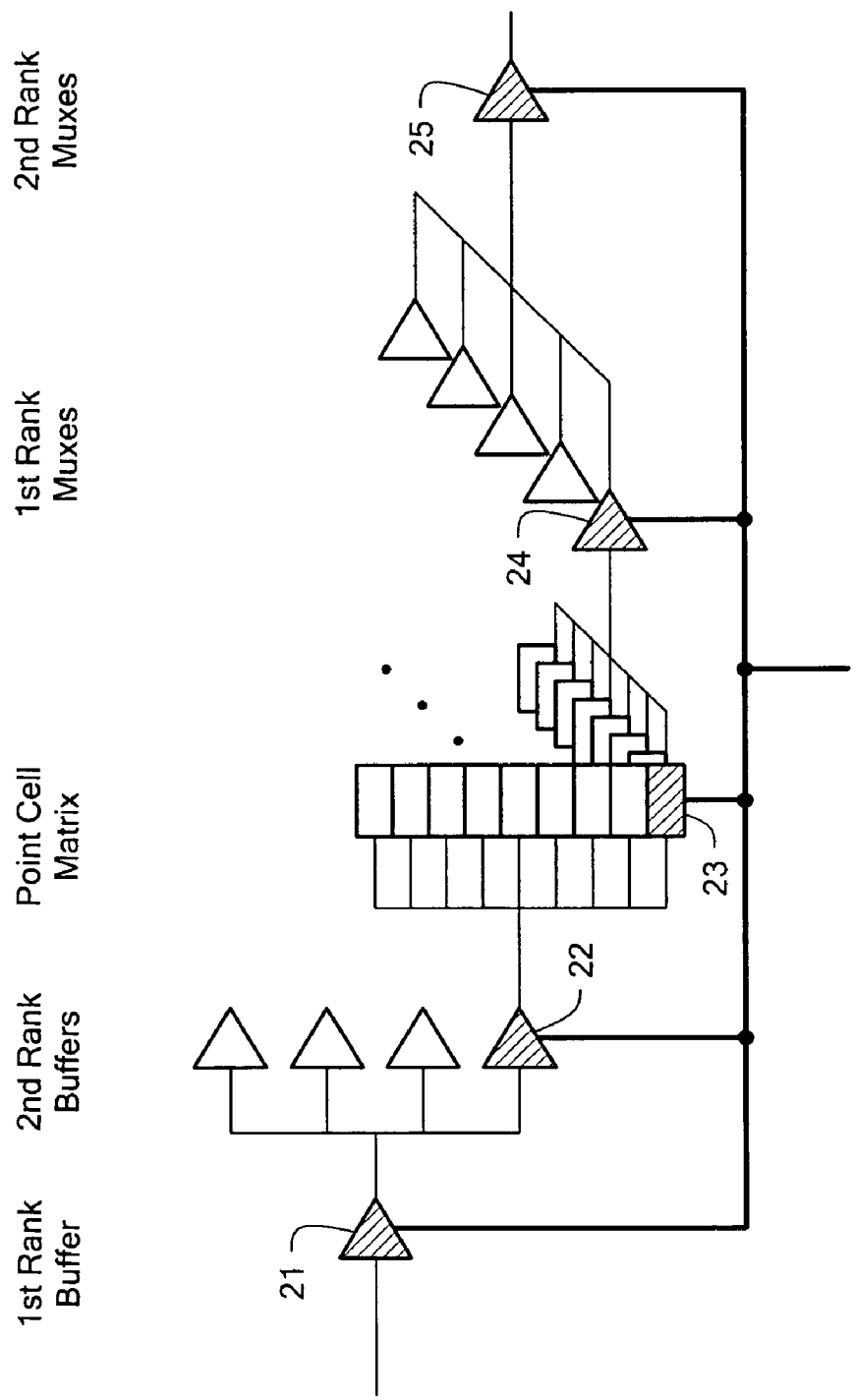
FIG. 2 provides a slice of a crosspoint switch according to FIG. 1 showing a single path connecting one input port to one output port.
Figure 3:
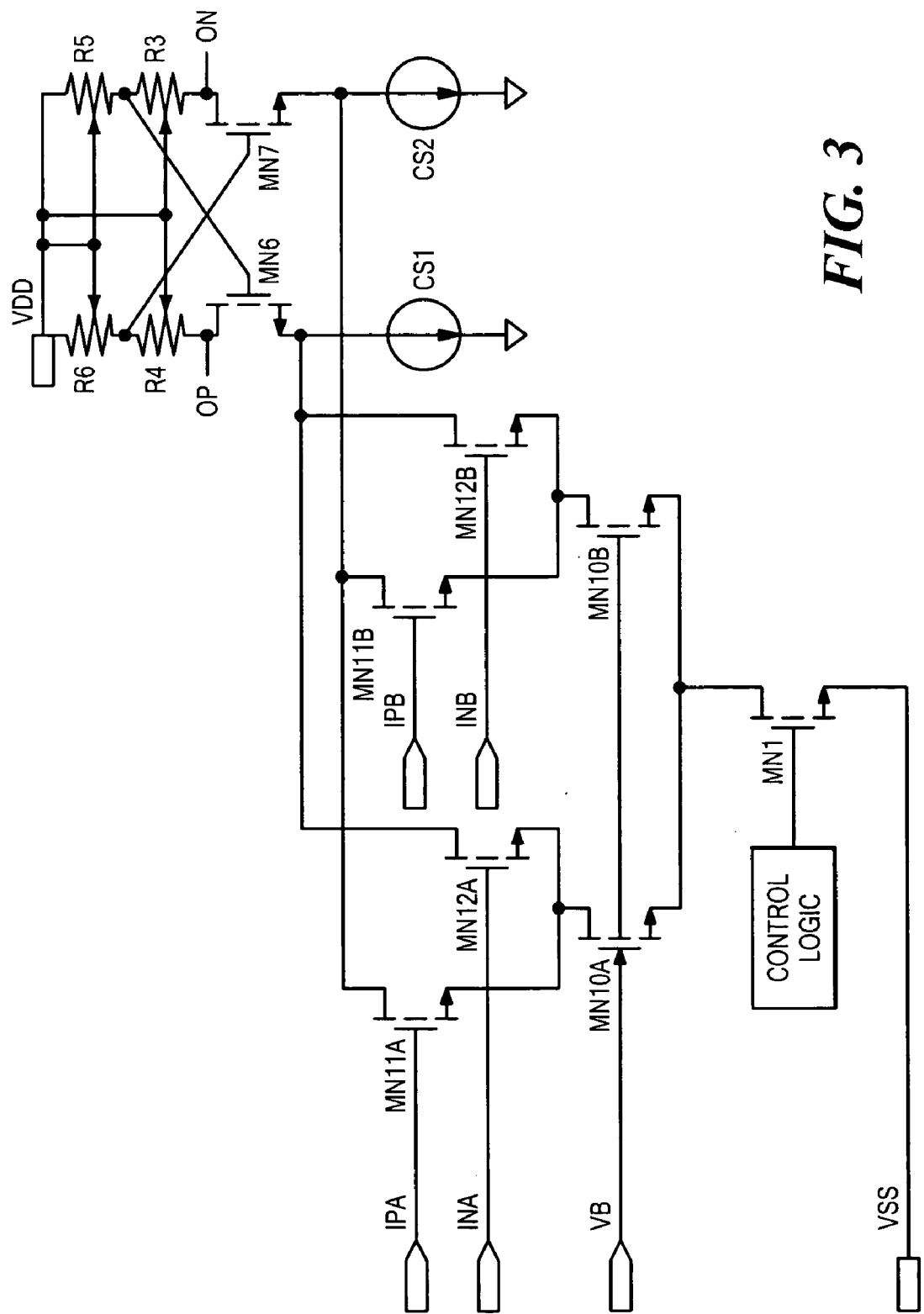
FIG. 3 shows the switching structure for a multiplexer according to one embodiment of the present invention.

FIG. 3 shows the switching structure for a multiplexer according to one embodiment of the present invention. One data path enters the figure on the upper left side as lines IPA and INA to the gates of differential switch pair MN11A and MN12A, and output via the drains of MN11A and MN12A. Another data path enters on lines IPB and INB to the gates of differential switch pair MN11B and MN12B, and output via the drains of MN11B and MN12B. Additional data paths are implemented similarly. The sources of each differential switch pair MN11A/12A and MN11B/12B etc. are coupled to respective switched tail current sources MN10A, MN10B, etc., which in turn are enabled by control switch MN1 controlled by the Control Logic block.

In the prior art, the load circuit for such a differential current mode switch circuit would be a simple passive resistor circuit. But as explained above, circuit reactances become significant at high data speeds (e.g., 1 GHz and above) creating significant delays in signal rise and fall times which limit circuit response below what is required to support such high data speeds.

Figure 4:
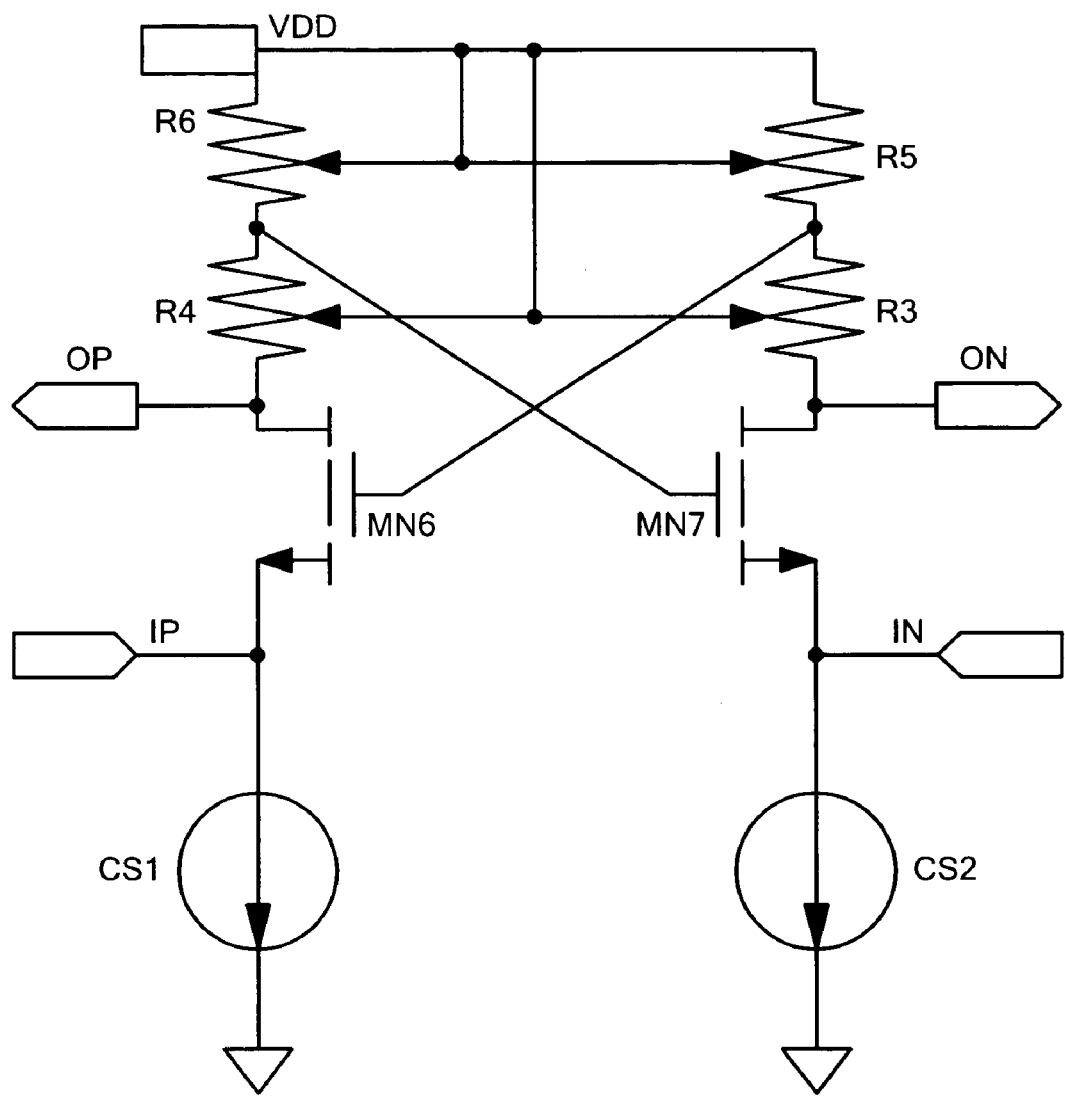
FIG. 4 shows an active load circuit for a high-speed multiplexer according to one embodiment of the present invention.

FIG. 4 shows details of an active load circuit (seen in the upper right portion of FIG. 3) for a high-speed differential logic multiplexer according to one embodiment of the present invention. The drains of multiple differential outputs from point cells (e.g., MN11A/MN12A and MN11B/MN12B in FIG. 3) are connected on the lines IP and IN to the differential input terminals of an active transimpedance load stage, the sources of MN6 and MN7. The differential pair MN6 and MN7 together with an active multiplexer stage such as MN11A/MN12A form a differential cascode arrangement. The drains of MN6 and MN7 provide differential data output signals OP and ON.

Using a differential cascode stage as the multiplexer load, the RC time constant at the multiplexer output nodes can be reduced while maintaining a desired swing and current level. In such an arrangement, the differential small-signal impedance looking into the sources of the cross-coupled common gate devices (MN6 and MN7) can be made to approach zero by appropriately sizing the switches themselves and the gate biasing resistors (R5/R6, the top resistor in each voltage divider leg) such that the resistor values (R5/R6) are equal to the inverse transconductance ($1/g_m$) of the switch pair (MN6/MN7) under balance. Under these conditions increased current $\Delta I$ through one switch MN6 requires a $\Delta I/g_m$ increase in the gate-source voltage $V_{gs}$ of MN6. However, MN7 current is also decreased by the same $\Delta I$, which raises the gate voltage of MN6 by $R5*\Delta I=1/g_m*\Delta I$. Thus, the increased MN6 gate-source voltage $V_{gs}$ is achieved without changing the actual circuit source voltage $V_s$, making $R_{in}=0\ \Omega$. The bottom voltage divider resistors in each leg (R3/R4) are then sized to achieve the desired swing. For large signal operation, the transconductance $g_m$ can not be assumed to be constant, so the matching of switch transconductance $g_m$ to the gate biasing resistors R5/R6 will not be exact, but the resistance seen by the large wiring capacitance at the sources of the MN6/MN7 is still greatly reduced over purely resistive loads (~1 kΩ vs. 2.5 kΩ). The constant current sources CS1 and CS2 in FIG. 4 maintain each respective switch MN6 and MN7 in higher, more constant transconductance $g_m$, thereby improving the degree of cancellation.

In one specific embodiment, medium threshold devices are chosen to allow headroom for both the cross-coupled devices MN6/MN7 and the input devices (e.g., MN11B/MN12B). For MN6/MN7 to remain in saturation, the output swing should be less than the voltage threshold $V_{th}$ of MN6/MN7. This would advise against using low voltage threshold LVT NMOS devices for the cross-coupled devices MN6/MN7. However, the larger voltage threshold $V_{th}$ of medium threshold devices pushes the drain-source voltages $V_{ds}$ of the input differential pair (e.g., MN11B/MN12B) below saturation $V_{ds,sat}$ by up to 150 mV in the worst case corner. This issue could be addressed in various ways, such as reducing the threshold voltage by using a replica circuit to bias the backgate connections of MN6/MN7 to a level near the drain supply voltage $V_{dd}$ (for example, about one threshold voltage below $V_{dd}$), thereby reducing the headroom penalty looking into the inputs of the active load. Alternatively, the input common mode level to the multiplexer stage could be reduced, being careful not to push the tail current source devices into triode operation. Using medium threshold devices may require scaling of the transistor widths due to the larger minimum width of these devices (e.g., 0.3 μm vs. 0.18 μm). This scaling may result in a significant capacitance penalty, but the wiring parasitics should still dominate the capacitance at this node.

Although various exemplary embodiments of the invention have been disclosed, it should be apparent to those skilled in the art that various changes and modifications can be made which will achieve some of the advantages of the invention without departing from the true scope of the invention.

What is claimed is:

1. A circuit for a high speed digital multiplexer, the circuit comprising:
   an active load circuit connected to an output of the high speed digital multiplexer and loading the multiplexer output with an active transimpedance stage having at least one active device and an input resistance less than the intrinsic input resistance of the active device to reduce the RC time constant at the multiplexer output.

2. A circuit according to claim 1, wherein the digital multiplexer is a current mode logic circuit.

3. A circuit according to claim 1, wherein the active load circuit further comprises:
   two active devices connected to the multiplexer output so as to form a differential cascode circuit.

4. A circuit according to claim 3, further comprising:
   for each active device, a biasing control resistor cross-coupled to a current supply path of the other active device, the biasing control resistor establishing a device biasing voltage that controls gain of the device.

5. A circuit according to claim 4, wherein the value of each biasing control resistor is equal to the inverse transconductance of its active device.

6. A circuit according to claim 4, further comprising:
   for each active device, a swing setting resistor connecting an output node of the active device to the control biasing resistor of the other active device, the swing setting resistor establishing a voltage swing for its active device.

7. A circuit according to claim 4, further comprising:
   for each active device, an associated current source for establishing the transconductance of the active device.

8. A circuit according to claim 3, wherein the active devices are medium threshold devices.

9. A method for loading a high speed digital multiplexer, the method comprising:
connecting an active load circuit to an output of the high speed digital multiplexer so as to load the multiplexer with an active transimpedance stage having at least one active device and an input resistance less than the intrinsic input resistance of the active device to reduce the RC time constant at the multiplexer output.

10. A method according to claim 9, wherein the digital multiplexer is a current mode logic circuit.

11. A method according to claim 9, wherein the active load circuit includes two active devices connected to the multiplexer output so as to form a differential cascode circuit.

12. A method according to claim 11, further comprising:
for each active device, establishing a device biasing voltage that control gain of the device using a biasing control resistor cross-coupled to a current supply path of the other active device.

13. A method according to claim 12, wherein the value of each biasing control resistor is equal to the inverse transconductance of its active device.

14. A method according to claim 12, further comprising:
for each active device, providing a swing setting resistor connected an output node of the active device to the control biasing resistor of the other active device, the swing setting resistor establishing a voltage swing for its active device.

15. A method according to claim 12, further comprising:
for each active device, establishing the transconductance of the active device with an associated current source.

16. A method according to claim 11, wherein the active devices are medium threshold devices.

17. A high speed digital multiplexer comprising:
an active load circuit connected to an output of the high speed digital multiplexer and loading the multiplexer output with an active transimpedance stage having at least one active device and an input resistance less than the intrinsic input resistance of the active device to reduce the RC time constant at the multiplexer output.

18. A high speed digital multiplexer according to claim 17, wherein the digital multiplexer is a current mode logic circuit.

19. A high speed digital multiplexer according to claim 17, wherein the active load circuit further comprise:
two active connected to the multiplexer output so as to form a differential cascode circuit.

20. A high speed digital multiplexer according to claim 19, further comprising:
for each active device, a biasing control resistor cross-coupled to a current supply path of the other active device, the biasing control resistor establishing a device biasing voltage that controls gain of the device.

21. A high speed digital multiplexer according to claim 20, wherein the value of each biasing control resistor is equal to the inverse transconductance of its active device.

22. A high speed digital multiplexer according to claim 20, further comprising:
for each active device, a swing setting resistor connecting an output node of the active device to the control biasing resistor of the other active device, the swing setting resistor establishing a voltage swing for its active device.

23. A high speed digital multiplexer according to claim 20, further comprising:
for each active device, an associated current source for establishing the transconductance of the active device.

24. A high speed digital multiplexer according to claim 19, wherein the active device are medium threshold device.

25. A crosspoint switch comprising:
an active load circuit connected to an output of a high speed digital multiplexer on the crosspoint switch and loading the multiplexer output with an active transimpedance stage having at least one active device and an input resistance less than the intrinsic input resistance of the active device to reduce the RC time constant at the multiplexer output.

26. A crosspoint switch according to claim 25, wherein the digital multiplexer is a current mode logic circuit.

27. A crosspoint switch according to claim 25, wherein the active load circuit further comprising:
two active devices connected to the multiplexer output so as to form a differential cascode circuit.

28. A crosspoint switch according to claim 27, further comprising:
for each active device, a biasing control resistor cross-coupled to a current supply path of the other active device, the biasing control resistor establishing a device biasing voltage that controls gain of the device.

29. A crosspoint switch according to claim 28, wherein the value of each biasing control resistor is equal to the inverse transconductance of its active device.

30. A crosspoint switch according to claim 28, further comprising:
for each active device, a swing setting resistor connecting an output node of the active device to the control biasing resistor of the other active device, the swing setting resistor establishing a voltage swing for its active device.

31. A crosspoint switch according to claim 28, further comprising:
for each active device, an associated current source for establishing the transconductance of the active device.

32. A crosspoint switch according to claim 27, wherein the active devices are medium threshold devices.

* * * * *

UNITED STATES PATENT AND TRADEMARK OFFICE
CERTIFICATE OF CORRECTION

PATENT NO.        : 7,199,619 B2                                                Page 1 of 1
APPLICATION NO. : 10/945144
DATED             : April 3, 2007
INVENTOR(S)       : Kimo Y.F. Tam It is certified that error appears in the above-identified patent and that said Letters Patent is hereby corrected as shown below:

Col. 5, line 45
  replace "comprise"
  with --comprises--.

Col. 5, line 46
  replace "active connected"
  with --active devices connected--.

Col. 6, line 16
  replace "device are medium threshold device"
  with --devices are medium threshold devices--.

Col. 6, line 28
  replace "comprising"
  with --comprises--.

Signed and Sealed this

Fifth Day of June, 2007

JON W. DUDAS
*Director of the United States Patent and Trademark Office*